United States Patent
Chen et al.

(10) Patent No.: US 9,620,496 B2
(45) Date of Patent: Apr. 11, 2017

(54) STACKED PROTECTION DEVICES WITH OVERSHOOT PROTECTION AND RELATED FABRICATION METHODS

(71) Applicants: Weize Chen, Phoenix, AZ (US); Hubert M. Bode, Haar (DE); Andreas Laudenbach, Haag (DE); Kurt U. Neugebauer, Vaterstetten (DE); Patrice M. Parris, Phoenix, AZ (US)

(72) Inventors: Weize Chen, Phoenix, AZ (US); Hubert M. Bode, Haar (DE); Andreas Laudenbach, Haag (DE); Kurt U. Neugebauer, Vaterstetten (DE); Patrice M. Parris, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 59 days.

(21) Appl. No.: 14/644,041

(22) Filed: Mar. 10, 2015

(65) Prior Publication Data

US 2016/0268245 A1 Sep. 15, 2016

(51) Int. Cl.
| | |
|---|---|
| *H02H 3/00* | (2006.01) |
| *H02H 3/02* | (2006.01) |
| *H02H 9/04* | (2006.01) |
| *H01L 27/02* | (2006.01) |
| *H01L 27/06* | (2006.01) |
| *H01L 21/8222* | (2006.01) |

(52) U.S. Cl.
CPC ...... *H01L 27/0248* (2013.01); *H01L 21/8222* (2013.01); *H01L 27/0259* (2013.01); *H01L 27/067* (2013.01)

(58) Field of Classification Search
CPC ............. H02H 9/00; H02H 9/04; H02H 9/042
USPC .......................................................... 361/56
See application file for complete search history.

(56) References Cited

U.S. PATENT DOCUMENTS

| | | | |
|---|---|---|---|
| 4,268,846 | A | 5/1981 | Spellman et al. |
| 5,212,618 | A | 5/1993 | O'Neill et al. |
| 5,825,600 | A | 10/1998 | Watt |
| 6,157,530 | A | 12/2000 | Pequignot et al. |
| 6,600,356 | B1 | 7/2003 | Weiss |
| 7,911,750 | B2 | 3/2011 | Zhan et al. |
| 8,242,566 | B2 | 8/2012 | Zhan et al. |
| 8,279,566 | B2 | 10/2012 | Whitfield et al. |

(Continued)

OTHER PUBLICATIONS

USPTO, Office Action in U.S. Appl. No. 14/034,213, mailed May 14, 2015.

(Continued)

*Primary Examiner* — Dharti Patel

(57) ABSTRACT

Protection circuits, device structures and related fabrication methods are provided. An exemplary protection circuit includes a first protection arrangement and a second protection arrangement. The first protection arrangement includes a first transistor having a first collector, a first emitter, and a first base coupled to the first emitter at a first node, and a second transistor having a second collector, a second emitter, and a second base coupled to the second emitter at a second node, the second collector being coupled to the first collector at a third node. The second protection arrangement is coupled electrically in series between the second node and a fourth node. The protection circuit further includes a first diode coupled between the third node and the fourth node.

20 Claims, 9 Drawing Sheets

(56) References Cited

U.S. PATENT DOCUMENTS

| | | |
|---|---|---|
| 8,432,654 B2 | 4/2013 | Whitfield et al. |
| 2013/0075854 A1 | 3/2013 | Chang et al. |
| 2013/0279051 A1* | 10/2013 | Gill .................. H02H 9/041 361/56 |
| 2015/0085407 A1 | 3/2015 | Chen et al. |

OTHER PUBLICATIONS

Chen, W., US Patent Application entitled "Stacked Protection Devices and Related Fabrication Methods," filed on Sep. 23, 2013.
Parris, Patrice M., US Patent Application entitled, "Semiconductor Device and Related Protection Methods," filed on Dec. 11, 2014.
Sarbishaei, H. et al., "A New Flip-Flop-Based Transient Power Supply Clamp for ESD Protection," IEEE Transactions on Device and Materials Reliability, vol. 8, No. 2, Jun. 2008.
USPTO, Final Office Action in U.S. Appl. No. 14/034,213, mailed Nov. 17, 2015.

* cited by examiner

STACKED PROTECTION DEVICES WITH
OVERSHOOT PROTECTION AND RELATED
FABRICATION METHODS

TECHNICAL FIELD

Embodiments of the subject matter described herein relate generally to electronic devices, and more particularly, to electrostatic discharge protection devices and related fabrication methods.

BACKGROUND

Modern electronic devices, and particularly, integrated circuits, are at risk of damage due to electrostatic discharge (ESD) events. During an ESD event, a voltage (or current) may be provided to one or more terminals of an electronic device that causes the voltage between those terminals to exceed the designed maximum voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages across electrical components during ESD events.

To avoid interfering with normal operation of the device being protected, the discharge protection circuitry is typically designed to turn on and conduct current when the applied voltage exceeds the operating voltage of the device but before the applied voltage exceeds the breakdown voltage of the device. In practice, the discharge protection circuitry may continue to conduct current after being triggered by a transient voltage until the applied voltage is decreased below a particular voltage, referred to as a holding (or snapback) voltage. When the holding voltage is less than the design voltage, discharge protection circuitry may be susceptible to latchup and continue to conduct current at the normal operating voltage, thereby impairing the functionality of the discharge protection circuitry after an ESD event. For example, a transient noise superimposed on a supply voltage may cause the discharge protection circuitry to turn on and continue conducting current after the transient noise is removed.

Multiple instances of protection circuitry may be used to increase the triggering voltage and/or the holding voltage, for example, by "stacking" or otherwise configuring the instances of protection circuitry so that the total triggering and/or holding voltage corresponds to a sum of the triggering and/or holding voltages of the individual instances of protection circuitry. However, due to parasitic capacitances, using multiple instances of protection circuitry undesirably introduces a delay between when the triggering voltage of the stacked protection circuitry is reached and when the voltage propagates through the individual instances of protection circuitry so that the stacked protection circuitry is fully turned on. During this period of time, the ESD voltage may continue to increase and overshoot the breakdown voltage of the circuitry being protected. An individual instance of protection circuitry may be designed for a higher triggering voltage and/or holding voltage without exhibiting the propagation delay associated with multiple stacked instances of protection circuitry; however, such a larger protection circuit typically consumes additional die area beyond that required for stacked protection circuitry providing the same level of protection. Accordingly, it is desirable to reduce the likelihood of voltage overshoot without increasing the die area allocated to the protection circuitry.

BRIEF DESCRIPTION OF THE DRAWINGS

The various embodiments will hereinafter be described in conjunction with the following drawing figures, which are not necessarily drawn to scale, wherein like numerals denote like elements, and wherein.

DETAILED DESCRIPTION

Figure 1:
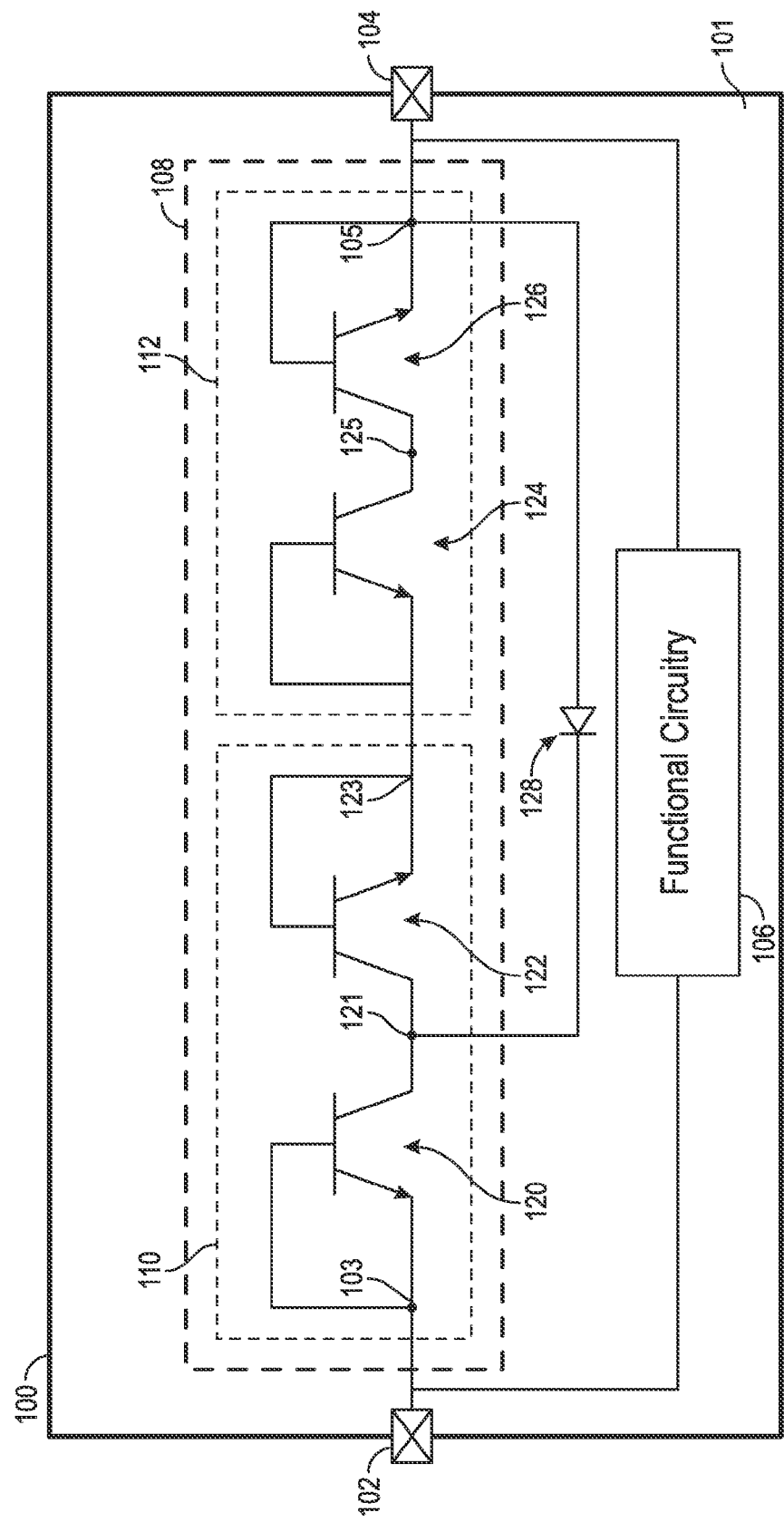
FIG. 1 is a schematic diagram of an exemplary electronic device in accordance with one embodiment of the invention.

The following detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the following detailed description.

Embodiments of the subject matter described herein relate to electronic devices that include multiple instances of electrostatic discharge (ESD) protection circuitry that are stacked, cascoded, or otherwise configured such that they are effectively electrically in series with one another when activated (or turned on) to provide a higher level of ESD protection for a particular electronic device. In this regard, when each of the instances of the ESD protection circuitry are fully activated or turned on to conduct the ESD discharge current, substantially the same ESD discharge current flows through each of the instances of the ESD protection circuitry. In the illustrated embodiments described herein, the stacked instances of protection circuitry are identical to one another; however, it will be appreciated that in alternative embodiments, the configuration of one instance of protection circuitry may be different from another instance of protection circuitry.

In exemplary embodiments, an auxiliary shunting diode is provided electrically parallel to at least one of the stacked instances of protection circuitry. The auxiliary diode is designed to experience breakdown and conduct at least a portion of the ESD discharge current during the period of time before the entirety of the stacked protection circuitry is fully turned on, thereby compensating for the propagation delay between when an ESD voltage is applied at a device terminal and when the stacked protection circuitry clamps the voltage at the device terminal to the holding voltage. In this regard, the auxiliary diode may be designed to have a breakdown voltage that is greater than the holding voltage of the stacked protection circuitry so that the diode stops conducting current and is effectively an open circuit once each instance of protection circuitry in the stacked arrangement is fully activated or otherwise turned on. Additionally or alternatively, the auxiliary diode may be designed to provide a lower conductance (or higher resistance) after exhibiting breakdown than the parallel portions of the stacked protection circuitry. Thus, after the stacked protection circuitry is fully turned on, a negligible amount of discharge current flows through the auxiliary diode and substantially all of the discharge current is conducted by the stacked protection circuitry, effectively placing the stacked instances of protection circuitry electrically in series. At the same time, the breakdown voltage of the auxiliary diode may be less than or equal to the cumulative breakdown voltage associated with the portions of the stacked protection circuitry that the auxiliary diode is effectively parallel to so that the diode conducts the ESD discharge current when the parallel portions of the stacked protection circuitry are in the process of being activated or turned on.

In exemplary embodiments, a first instance of protection circuitry coupled to a first device terminal includes a pair of bipolar junction transistor (BJT) elements configured to provide bidirectional ESD protection (e.g., by conducting discharge current in either direction), with the collectors of the BJT elements being electrically connected to one another at a common collector node. The common collector node may be realized as one or more contiguous regions of semiconductor material having the same conductivity type that function as a common collector region. Similarly, a second instance of protection circuitry stacked between the first protection circuitry and a second device terminal may include a second pair of BJT elements configured to provide bidirectional ESD protection. In exemplary embodiments described herein, the auxiliary diode element is electrically connected between the common collector node of the first instance of protection circuitry and the second device terminal to conduct discharge current from the common collector node to the second device terminal until all of the BJT elements of the stacked instances of protection circuitry are fully turned on.

Turning now to FIG. 1, an exemplary electronic device package 100 includes one or more package interfaces 102, 104, functional circuitry 106 coupled to the package interfaces 102, 104, and stacked protection arrangement 108 coupled to the interfaces 102, 104. In exemplary embodiments, the functional circuitry 106 and the stacked protection arrangement 108 are formed, fabricated, mounted, or otherwise provided on a substrate (or die) 101 and encapsulated in a common device package to achieve the packaged electronic device 100. In this regard, in some embodiments, the substrate 101 may be realized as a semiconductor substrate having both the functional circuitry 106 and the stacked protection arrangement 108 fabricated thereon. In other embodiments, the substrate 101 may be realized as a package substrate (e.g., a lead frame, circuit board, or the like) to which the functional circuitry 106 and the stacked protection arrangement 108 are soldered, affixed, or otherwise mounted. It should be understood that FIG. 1 is a simplified representation of the electronic device 100 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner.

The package interfaces 102, 104 generally represent the physical input/output interfaces to/from the functional circuitry 106 encapsulated in the electronic device 100. Depending on the embodiment, each of the package interfaces 102, 104 may be realized as an individual pin, pad, lead, terminal, solder ball, or another suitable physical interface to the electronic device 100. In accordance with one or more embodiments, the intended normal operating voltage for the first package interface 102 is greater than the design voltage for the second package interface 104. For example, the first package interface 102 may be realized as a positive reference (or supply) voltage input to the electronic device 100 and the second package interface 104 is realized as a negative reference (or ground) voltage input to the electronic device 100. For purposes of explanation, but without limitation, the first package interface 102 may alternatively be referred to herein as the higher voltage terminal, the positive reference voltage terminal, the supply voltage terminal, or the like, while the second package interface 104 may alternatively be referred to herein as the lower voltage terminal, the negative reference voltage terminal, the ground voltage terminal, or the like.

The functional circuitry 106 generally represents the components of the electronic device 100 configured to provide the desired functionality for the electronic device 100. In this regard, depending on the embodiment, the functional circuitry 106 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide the desired functionality for the electronic device 100. In an exemplary embodiment, the functional circuitry 106 is coupled to the package interfaces 102, 104 to receive a supply voltage, design voltage, or another operating voltage that facilitates the desired operation of the functional circuitry 106.

Still referring to FIG. 1, the stacked protection arrangement 108 is electrically connected between the higher voltage terminal 102 and the lower voltage terminal 104 and configured electrically parallel to the functional circuitry 106 to protect the functional circuitry 106 from a transient voltage difference between the device terminals 102, 104 that exceeds a breakdown voltage ($V_B$) of the functional circuitry 106. The stacked protection arrangement 108 functions as an ESD voltage clamp that begins conducting a discharge current in a forward direction when a transient voltage at the higher voltage terminal 102 relative to the voltage at the lower voltage terminal 104 exceeds a transient triggering voltage ($V_{TT}$) of the stacked protection arrangement 108, or alternatively, when a steady state (or DC)

voltage at the higher voltage terminal 102 relative to the voltage at the lower voltage terminal 104 exceeds a steady state (or DC) breakdown voltage ($V_{TDC}$) of the stacked protection arrangement 108. In this regard, both the steady state (or DC) breakdown voltage ($V_{TDC}$) and transient triggering voltage ($V_{TI}$) of the stacked protection arrangement 108 are chosen to be greater than the supply (or operating) voltage ($V_O$) of the functional circuitry 106 but less than the breakdown voltage ($V_B$) of the functional circuitry 106. In this manner, the stacked protection arrangement 108 conducts current when the voltage difference between the terminals 102, 104 exceeds an ESD triggering voltage (i.e., the DC breakdown voltage ($V_{TDC}$) or the transient triggering voltage ($V_{TI}$)) and thereby clamps the voltage difference that the functional circuitry 106 is exposed to. Thus, the likelihood of the functional circuitry 106 being exposed to a voltage difference that exceeds the breakdown voltage ($V_B$) of the functional circuitry 106 during an ESD event is reduced. As described in greater detail below in the context of FIG. 3, in exemplary embodiments, the stacked protection arrangement 108 also functions as an ESD voltage clamp when the transient voltage at the lower voltage terminal 104 relative to the voltage at the higher voltage terminal 102 exceeds a reverse triggering/breakdown voltage of the stacked protection arrangement 108. In this regard, the stacked protection arrangement 108 may be understood as providing bidirectional ESD protection.

In exemplary embodiments, the stacked protection arrangement 108 includes a first protection circuitry arrangement 110 coupled to the higher voltage terminal 102 and a second protection circuitry arrangement 112 coupled between the first protection circuitry arrangement 110 and the lower voltage terminal 104. The first protection circuitry arrangement 110 and the second protection circuitry arrangement 112 are stacked or cascoded and connected effectively in series between the terminals 102, 104 to achieve the desired triggering voltage and/or holding voltage required by the particular functional circuitry 106 of interest. The stacked protection circuitry arrangements 110, 112 may be formed or otherwise provided on the substrate 101 adjacent to or otherwise proximate one another as illustrated in FIGS. 2-6. Although not illustrated in FIG. 1, in practice, additional protection circuitry arrangements may be provided in series with the stacked protection circuitry arrangements 110, 112 to further increase the triggering voltage and/or holding voltage of the stacked protection arrangement 108. Accordingly, the subject matter described herein is not limited to any particular number of protection circuitry arrangements that are included in the stacked protection arrangement 108.

In exemplary embodiments, the first protection circuitry arrangement 110 is bidirectional and capable of conducting discharge current in either direction relative to the higher voltage terminal 102. The illustrated first protection circuitry arrangement 110 includes a pair of bipolar junction transistor (BJT) elements 120, 122 configured to provide an ESD voltage clamp. As illustrated, a first NPN BJT element 120 has an emitter electrode coupled to the higher voltage terminal 102 at a first reference voltage node 103, a base electrode electrically connected directly to the emitter electrode (e.g., short-circuited or via a negligible series impedance) and coupled to the higher voltage terminal 102 at the first reference voltage node 103, and a collector electrode coupled to the collector electrode of the second NPN BJT element 122 at a common collector node 121. The emitter electrode and the base electrode of the second BJT element 122 are electrically connected (or short-circuited) at another node 123 that is coupled to the lower voltage terminal 104 via the second protection circuitry arrangement 112. In one or more exemplary embodiments, the collector electrodes of the BJT elements 120, 122 include or are otherwise coupled to a common doped region; that is, the BJT elements 120, 122 may share a common collector electrode region formed in a semiconductor substrate. It should be noted that while the subject matter may be described herein in the context of NPN bipolar junction transistor elements, the subject matter is not intended to be limited to NPN bipolar junction transistor elements and may be implemented in an equivalent manner for PNP bipolar junction transistor elements. That said, the benefits of NPN bipolar junction transistor elements often make NPN bipolar junction transistor elements preferable for many applications. Accordingly, for purposes of explanation but without limitation, the subject matter is described herein in the context of NPN devices.

In a similar manner, the second protection circuitry arrangement 112 is bidirectional and capable of conducting discharge current in either direction relative to the lower voltage terminal 104. The second protection circuitry arrangement 112 includes a second pair of bipolar junction transistor (BJT) elements 124, 126 configured to provide an ESD voltage clamp. As illustrated, a third NPN BJT element 124 has an emitter electrode coupled to its base electrode at node 123 and coupled to the higher voltage terminal 102 via the first protection circuitry arrangement 110, and a collector electrode coupled to the collector electrode of the fourth NPN BJT element 126 at a common collector node 125. The emitter electrode and the base electrode of the fourth BJT element 126 are electrically connected (or short-circuited) at the node 105 coupled to the lower voltage terminal 104.

Still referring to FIG. 1, an auxiliary diode element 128 is configured to provide a parallel path for discharge current at the higher voltage terminal 102 before both the BJT 122 and the second protection circuitry arrangement 112 are fully turned on or activated in response to an ESD event. As described in greater detail below in the context of FIGS. 2-6, in exemplary embodiments, the auxiliary diode element 128 is integrated with the first protection circuitry arrangement 110 to breakdown and provide a shunt for discharge current from the common collector node 121 to a lower voltage node 105 corresponding to the substrate reference voltage, which, in the illustrated embodiment, is electrically connected to the lower voltage terminal 104. In this regard, the cathode of the auxiliary diode element 128 may be electrically connected to or otherwise integrated with a collector region of the first BJT 120 (or alternatively, a collector region of the second BJT 122), with the anode of the auxiliary diode element 128 being electrically connected to the lower voltage node 105.

The breakdown voltage of the diode element 128 is greater than the operating voltage of the functional circuitry 106, so that the diode element 128 does not conduct current during normal operation of the electronic device 100. In one or more embodiments, the breakdown voltage of the diode element 128 is less than or equal to the sum of the forward transient triggering voltage of the second BJT 122 and the forward transient triggering voltage of the second protection circuitry arrangement 112, such that the auxiliary diode element 128 conducts discharge current in response to an ESD event prior to one or more of the reverse-biased BJTs 122, 126 being fully activated or turned on (e.g., by experiencing breakdown). In other embodiments, the breakdown voltage of the diode element 128 is greater than or equal to the sum of the forward transient triggering voltage of the second BJT 122 and the forward transient triggering voltage of the second protection circuitry arrangement 112, such that the auxiliary diode element 128 does not conduct discharge current in response to an ESD event unless the ESD voltage overshoots the transient triggering voltage associated with the stacked protection circuitry arrangements 110, 112. In exemplary embodiments, the breakdown voltage of the diode element 128 is designed to be greater than the sum of the holding voltage of the second BJT 122 and the holding voltage of the second protection circuitry arrangement 112, so that the diode element 128 does not continue conducting discharge current after the BJTs 122, 126 experience breakdown.

In practice, when a transient voltage applied to the higher voltage device terminal 102 relative to the lower voltage device terminal 104 increases, very little current flows through the stacked protection circuitry arrangements 110, 112 until the transient triggering voltage ($V_{TT}$) is reached, at which point avalanche breakdown of the base-collector junction in the BJTs 122, 126 occurs and the stacked protection circuitry arrangements 110, 112 begin conducting an ESD discharge current from the higher voltage terminal 102 to the lower voltage terminal 104 via the BJTs 120, 122, 124, 126. In this regard, the transient triggering voltage of the stacked protection circuitry arrangements 110, 112 corresponds to the sum of the avalanche breakdown voltages of the BJTs 122, 126 plus the forward bias voltages of the BJTs 120, 124. To mitigate voltage overshoot at the device terminal 102 above the transient triggering voltage ($V_{TT}$), the breakdown voltage of the auxiliary diode element 128 is tuned to conduct at least a portion of the ESD discharge current during the time period required for the avalanche breakdown of BJTs 122, 126 and the forward biasing of BJT 124 to occur. For example, in one or more embodiments, the breakdown voltage of the auxiliary diode element 128 may be substantially equal to the sum of the avalanche breakdown voltages of the BJTs 122, 126 plus the forward bias voltage of the BJT 124. In such embodiments, the conductance of the auxiliary diode element 128 may also be tuned to be less than the conductance of the BJTs 122, 124, 126 (or alternatively, the resistance of the auxiliary diode element 128 may also be tuned to be greater than the resistance of the BJTs 122, 124, 126) so that negligible discharge current flows through the auxiliary diode element 128 after avalanche breakdown of the BJTs 122, 126 and the BJTs 122, 124, 126 are effectively electrically in series between the collector of the first BJT 120 and the lower voltage node 105. In another embodiment, the breakdown voltage of the auxiliary diode element 128 may be substantially equal to the transient triggering voltage ($V_{TT}$) of the stacked protection circuitry arrangements 110, 112, such that the auxiliary diode element 128 only conducts discharge current when the ESD voltage at the higher voltage terminal 102 exceeds the transient triggering voltage by more than the forward bias voltage of BJT 120. In such embodiments, after avalanche breakdown of BJTs 122, 126 occurs, the voltage between the common collector node 121 and the lower voltage node 105 is effectively clamped to a voltage that is less than the breakdown voltage of the auxiliary diode element 128, resulting in substantially zero discharge current flowing through the auxiliary diode element 128 once the BJTs 122, 124, 126 are fully turned on in response to the ESD event.

Figure 2:
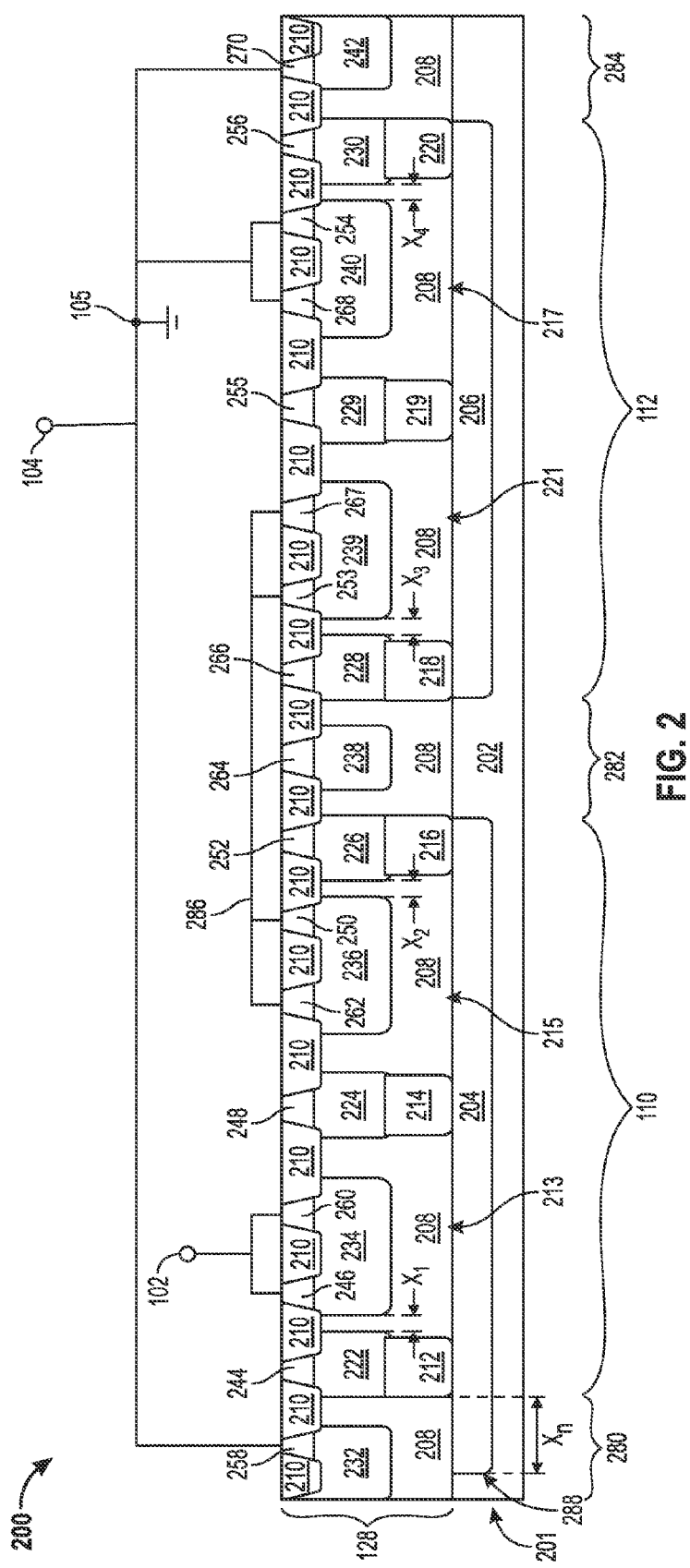
FIG. 2 depicts a cross-sectional view of one exemplary semiconductor device structure suitable for use as the stacked protection arrangement in the electronic device of FIG. 1 in accordance with one or more embodiments of the invention.

FIG. 2 illustrates, in cross-section, a semiconductor device structure 200 suitable for use as the stacked protection arrangement 108 in the electronic device 100 of FIG. 1 in accordance with one or more exemplary embodiments. The first BJT element 120 has a collector (comprised of regions 204, 212, 222, 244) and an emitter (comprised of region 246) having a first conductivity type (e.g., N-type), and a base (comprised of regions 213, 234, 260) having the opposite conductivity type (e.g., P-type). The emitter and base contact regions 246, 260 are short-circuited or otherwise electrically connected to one another and coupled to the device terminal 102, such that the electrical potential of the emitter and base of the first BJT element 120 is substantially equal to the electrical potential at the device terminal 102. The second BJT element 122 has a collector (comprised of regions 204, 216, 226, 252) that is electrically connected to the collector of the first BJT element 120. In the illustrated embodiment, the collectors of the BJT elements 120, 122 are integral or otherwise abut one another via the common doped region 204 formed in the semiconductor substrate material 202. The BJT elements 120, 122 may also include a common vertical collector region comprised of regions 214, 224, 248 that reside laterally between the respective base regions 213, 215 of the respective BJT elements 120, 122 to separate the respective base regions 213, 215. In exemplary embodiments, the collector regions 204, 212, 214, 216, 222, 224, 226, 244, 248, 252 are floating and not directly connected to any device terminals or any other external circuitry that could ground or otherwise influence the electrical potential of the common collector. The emitter (comprised of region 250) and base (comprised of regions 215, 236, 262) of the second BJT element 122 are also short-circuited or otherwise electrically connected to one another and coupled to the emitter (comprised of region 253) and base (comprised of regions 221, 239, 267) of the third BJT element 124 in the second protection circuitry arrangement 112.

The emitter and base contact regions 253, 267 of the third BJT element 124 are short-circuited or otherwise electrically connected to one another and coupled to the base and emitter contact regions 250, 262 of the second BJT element 122, such that the electrical potential of the emitter and base of the third BJT element 124 is substantially equal to the electrical potential of the emitter and base of the second BJT element 122. The third BJT element 124 has a collector (comprised of regions 218, 228, 266) electrically connected to the collector (comprised of regions 220, 230, 256) of the fourth BJT element 126 via a common doped region 206 of the same conductivity type, such that the collectors of the BJT elements 124, 126 are integral or otherwise abut one another. The BJT elements 124, 126 may also include a common vertical collector region comprised of regions 219, 229, 255 that reside laterally between the respective base regions 217, 221 of the respective BJT elements 124, 126 to separate the respective base regions. Again, the collector regions 206, 218, 219, 220, 228, 229, 230, 255, 256, 266 are floating and not directly connected to any device terminals or any other external circuitry that could ground or otherwise influence the electrical potential of the common collector. The emitter (comprised of region 254) and base (comprised of regions 217, 240, 268) of the fourth BJT element 126 are short-circuited or otherwise electrically connected to one another and coupled to the lower voltage terminal 104, such that the electrical potential of the emitter and base of the fourth BJT element 126 is substantially equal to the electrical potential of the lower voltage terminal 104.

In the illustrated embodiment, the auxiliary diode element 128 is formed between the common collector of the first protection circuitry arrangement 110 and a contact region 258 that is electrically connected to the substrate reference voltage node 105, which, in turn, is electrically connected to device terminal 104. The auxiliary diode element 128 is formed in a substrate shunt region 280 adjacent to the first BJT 120 of the first protection circuitry arrangement 110. The auxiliary diode element 128 includes an anode well region 232 having the same conductivity type as the underlying substrate semiconductor material 202, 208 (which is opposite the conductivity of the adjacent collector regions 212, 222, 244), with the anode contact region 258 of the same conductivity type being formed within the anode well region 232. In the embodiment of FIG. 2, the cathode of the auxiliary diode element 128 is realized as a portion 288 of the buried collector region 204 that extends laterally beyond the vertical collector regions 212, 222, 244 of the first BJT 120. The breakdown voltage of the diode element 128 is dictated by the distance ($x_n$) by which the extending portion 288 extends beyond the peripheral lateral boundaries of the vertical collector regions 212, 222, 244, the vertical distance between the extending portion 288 and the anode well region 232, and the respective dopant concentrations of the epitaxial layer 208, the anode well region 232, and the buried region 204. In this regard, the breakdown voltage of a vertical diode formed between the cathode region 288 and the overlying anode regions 232, 258 decreases as the distance between the extending portion 288 and the anode regions 232, 258 decreases (or alternatively, as the amount of overlap of the extending portion 288 underneath the contact region 258). In the embodiment of FIG. 2, the width ($x_n$) of the extending portion 288 is chosen to ensure that breakdown occurs between the extending portion 288 and the anode well region 232 before any breakdown between the anode well region 232 and the neighboring collector regions 212, 222. Additionally, in embodiments where the epitaxial layer 208 includes a thin base layer having a higher dopant concentration than the remaining overlying portions of the epitaxial layer 208, a lateral diode may also be formed between the lateral boundary of the extending portion 288 and the thin base layer of the epitaxial layer 208 electrically parallel to the vertical diode formed between the extending portion 288 and the anode well region 232.

The illustrated protection device structure 200 also includes one or more additional substrate shunt regions 282, 284 adjacent to the respective protection circuitry arrangements 110, 112 to provide a shunt to the substrate 201 during an ESD event when a lower transient voltage is applied at the higher voltage terminal 102 relative to the lower voltage terminal 104. The substrate shunt region 282 residing laterally between BJTs 122, 124 includes a well region 238 having the same conductivity type as the underlying substrate semiconductor material 202, 208 and a substrate contact region 264 of the same conductivity type within the well region, and similarly, the substrate shunt region 284 adjacent to the fourth BJT 126 includes a well region 242 and a substrate contact region 270. In the illustrated embodiment, the substrate contact region 270 of the substrate shunt region 284 is also coupled to the lower voltage terminal 104, however, in alternative embodiments, the substrate contact region 264 may also be coupled to the lower voltage terminal 104 and/or the substrate contact region 270. For example, the substrate shunt regions 282, 284 may provide a contiguous region that circumscribes the second protection circuitry arrangement 112, such that the substrate contact regions 264, 270 are abutting or integral and electrically connected.

When an applied voltage (or electrical potential) at the higher voltage terminal 102 exceeds the applied voltage (or electrical potential) at the lower voltage terminal 104, the base-collector junction of the first BJT 120 (e.g., between base well region 234 and collector well region 222) is forward-biased, thereby raising the electrical potential of the common collector regions 204, 212, 214, 216, 222, 224, 226, 244, 248, 252. During an ESD event when a higher transient voltage is applied at terminal 102 relative to terminal 104, the collector potential increases until avalanche breakdown occurs across the collector-base junction of the second BJT 122 (e.g., between base well region 236 and collector well region 226). Avalanche breakdown across the collector-base junction of the second BJT 122, in turn, raises the electrical potential of the emitter and base contact regions 250, 262 of the second BJT 122 and forward-biases the base-collector junction of the third BJT 124, thereby raising the electrical potential of the collector regions 206, 218, 219, 220, 228, 229, 230, 255, 256, 266 until avalanche breakdown occurs across the collector-base junction of the fourth BJT 126 (e.g., between base well region 240 and collector well region 230).

When the base-collector junction of the first BJT 120 is forward-biased, the electrical potential of the cathode region 288 is also raised until breakdown occurs across the cathode-anode junction of the auxiliary diode element 128 (e.g., between anode well region 232 and cathode portion 288). In this regard, when breakdown occurs across the cathode-anode junction of the auxiliary diode element 128 before avalanche breakdown occurs across both the collector-base junction of the second BJT 122 and the collector-base junction of the fourth BJT 126, the auxiliary diode element 128 shunts discharge current from the collector of the first BJT 120 to the substrate, which is connected to the lower voltage terminal 104 via the contact regions 258, 270. As a result, the rate of increase of the ESD voltage is reduced, thereby reducing the amount or likelihood of the ESD voltage at the device terminal 102 overshooting the breakdown voltage of the functional circuitry 106. Once the avalanche breakdown occurs in both BJTs 122, 126, the discharge current conducted by the auxiliary diode element 128 decreases by virtue of the better conductance provided by the BJTs 122, 124, 126. In this manner, the stacked protection circuitry arrangements 110, 112 are configured electrically in series between the device terminals 102, 104 once fully turned on or activated, so that the forward holding voltage of the stacked protection arrangement 108 corresponds to the sum of the forward holding voltage of the first protection circuitry arrangement 110 and the forward holding voltage of the second protection circuitry arrangement 112.

It should be noted that the steady state (or DC) avalanche breakdown voltage of the collector-base junction of the second BJT 122 is dictated by the distance ($x_2$) between the higher conductivity base well region 236 and the collector well region 226 (or alternatively, the width of the portion of the lower conductivity epitaxial layer 208 residing between the base well region 236 and the collector well region 226) and the respective dopant concentrations of the epitaxial layer 208, the base well region 236, and the collector well region 226. Similarly, the steady state (or DC) avalanche breakdown voltage of the collector-base junction of the fourth BJT 126 is dictated by the distance ($x_4$) between the higher conductivity base well region 240 and the collector well region 230 (or alternatively, the width of the portion of the lower conductivity epitaxial layer 208 residing between the base well region 240 and the collector well region 230) and the respective dopant concentrations of the epitaxial layer 208, the base well region 240, and the collector well region 230. Similarly, the reverse triggering and/or breakdown voltage of the stacked protection arrangement 108 corresponds to the reverse triggering and/or breakdown voltage of the first BJT 120, which is dictated by the distance ($x_1$) between the higher conductivity base well region 234 and the collector well region 222 and the respective dopant concentrations of the epitaxial layer 208, the base well region 234, and the collector well region 222. Likewise, the reverse triggering and/or breakdown voltage of the third BJT 124 is dictated by the distance ($x_3$) between the higher conductivity base well region 239 and the collector well region 228.

Figure 3:
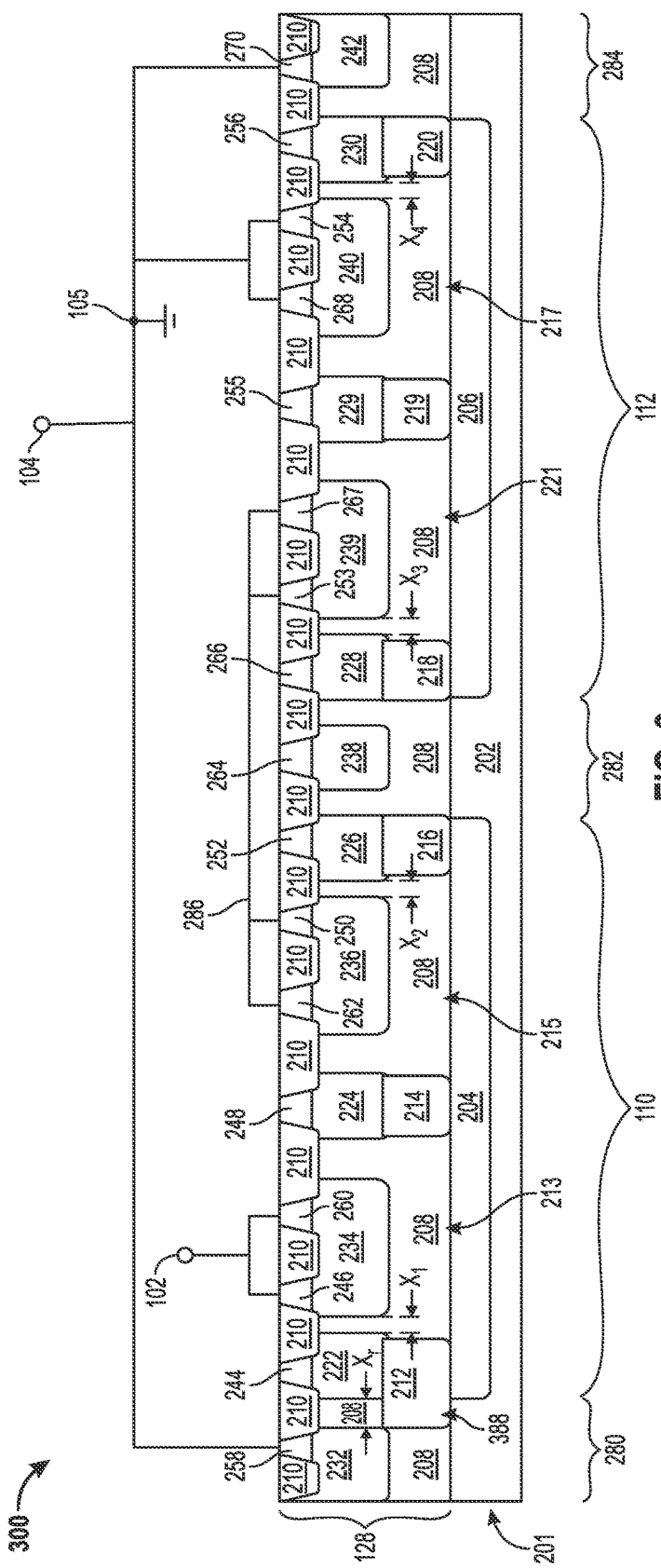
FIG. 3 depicts a cross-sectional view of another exemplary semiconductor device structure suitable for use as the stacked protection arrangement in the electronic device of FIG. 1 in accordance with one or more embodiments of the invention.

FIG. 3 illustrates, in cross-section, another embodiment of a semiconductor device structure 300 suitable for use as the stacked protection arrangement 108 in the electronic device 100 of FIG. 1. In the embodiment of FIG. 3, the auxiliary diode element 128 is formed between the sinker region 212 of the collector of the first BJT 120 and the opposite conductivity well region 232 within the diode region 280. The cathode of the auxiliary diode element 128 is realized as a portion 388 of the sinker region 212 that extends laterally beyond the lateral boundaries of the overlying well region 222 and the underlying buried region 204. The breakdown voltage of the diode element 128 is dictated by the distance ($x_r$) by which the extending portion 388 extends beyond the other collector regions 204, 222 and the respective dopant concentrations of the epitaxial layer 208, the anode well region 232, and the sinker region 212. The breakdown voltage of the auxiliary diode element 128 decreases as the distance between the extending portion 388 and the anode well region 232 decreases. In practice, the embodiment of FIG. 3 may be preferable based on manufacturability or other constraints of the particular technology or fabrication process being utilized.

Figure 4:
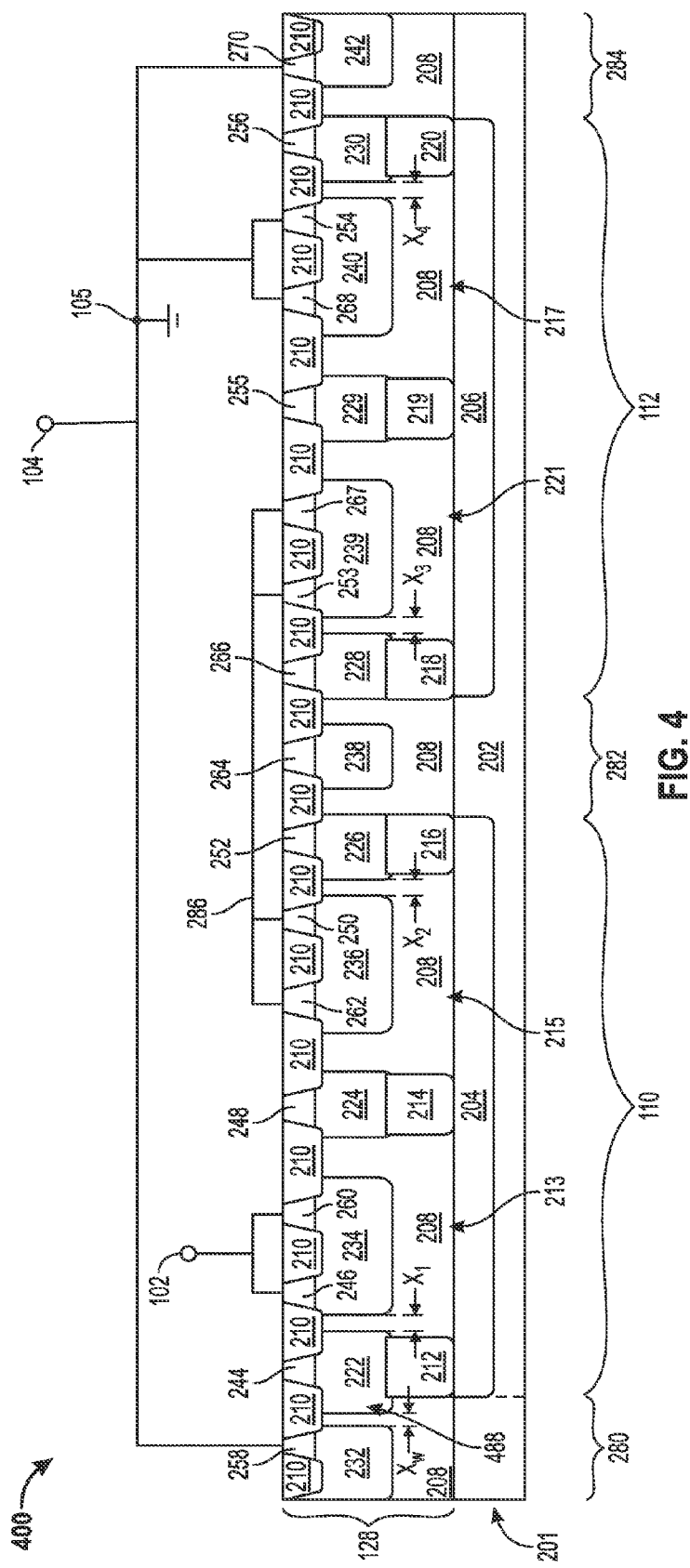
FIG. 4 depicts a cross-sectional view of another exemplary semiconductor device structure suitable for use as the stacked protection arrangement in the electronic device of FIG. 1 in accordance with one or more embodiments of the invention.

FIG. 4 illustrates, in cross-section, another embodiment of a semiconductor device structure 400 suitable for use as the stacked protection arrangement 108 in the electronic device 100 of FIG. 1. In the embodiment of FIG. 4, the auxiliary diode element 128 is realized as a lateral diode formed between the collector well region 222 of the first BJT 120 and the opposite conductivity anode well region 232. The cathode of the auxiliary diode element 128 is realized as the portion 488 of the collector well region 222 that extends laterally beyond the lateral boundaries of the underlying collector regions 204, 212. The breakdown voltage of the diode element 128 is dictated by the distance ($x_w$) between the peripheral lateral boundary of the extending portion 488 of the collector well region 222 and the inner lateral boundary of the anode well region 232 and the respective dopant concentrations of the epitaxial layer 208, the anode well region 232, and the collector well region 222. In practice, the embodiment of FIG. 4 may be preferable to avoid carriers generated by the diode breakdown traveling deeper within the substrate. Additionally, the embodiment of FIG. 4 may be preferable based on manufacturability or other constraints of the particular technology or fabrication process being utilized.

Figure 5:
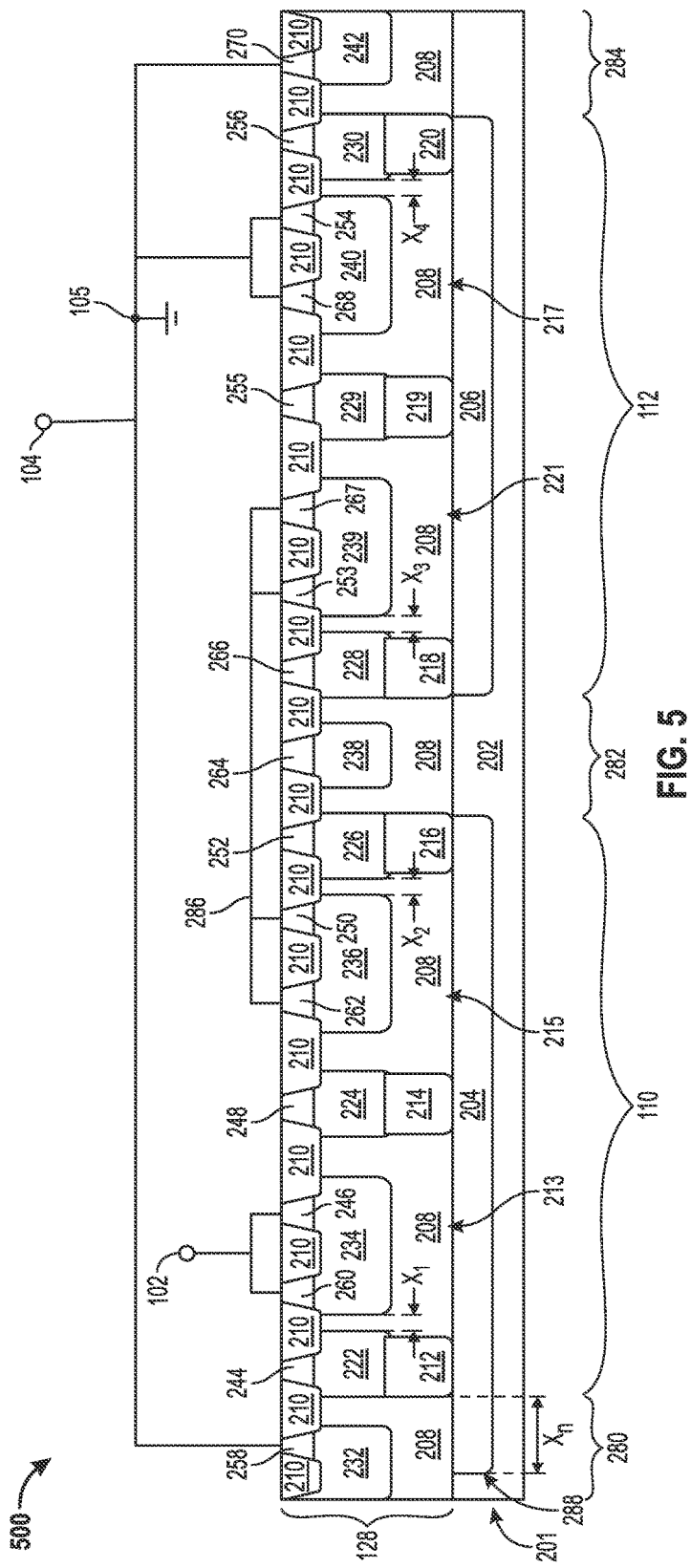
FIG. 5 depicts a cross-sectional view of another exemplary semiconductor device structure suitable for use as the stacked protection arrangement in the electronic device of FIG. 1 in accordance with one or more embodiments of the invention.

FIG. 5 illustrates, in cross-section, another embodiment of a semiconductor device structure 500 suitable for use as the stacked protection arrangement 108 in the electronic device 100 of FIG. 1. Similar to FIG. 2, the auxiliary diode element 128 is formed in the protection device structure 500 between an extending portion 288 of the buried region 204 and the anode well region 232 formed in the diode region 280 adjacent to the first BJT 120. In the embodiment of FIG. 5, the emitter region 246 of the first BJT 120 is disposed between the base contact region 260 and the central collector regions 214, 224, 248, such that an applied voltage at the higher voltage terminal 102 forward biases the base-collector junction of the first BJT 120 between base well regions 213, 234 and the central collector well region 224 of the first protection circuitry arrangement 110. Increasing the lateral separation between the diode region 280 and the forward-biased base-collector junction may reduce the susceptibility to latchup resulting from breakdown of the auxiliary diode element 128 (e.g., by auxiliary diode element 128 pulling down the electrical potential of the adjacent collector well region 222 to forward bias the junction between regions 222, 234). For example, compared to the embodiment of FIG. 2, the embodiment of FIG. 5 avoids forward biasing the emitter-base junction between emitter region 246 and base well region 234 when current flows from the device terminal 102 through regions 212, 222, 234, 246, 260 and then through the diode region 280 when the diode 128 breaks down and the relatively large discharge current from the base region 260 to the collector region 222 would otherwise cause a voltage difference between regions 234, 246 that could forward bias the base-emitter junction.

Figure 6:
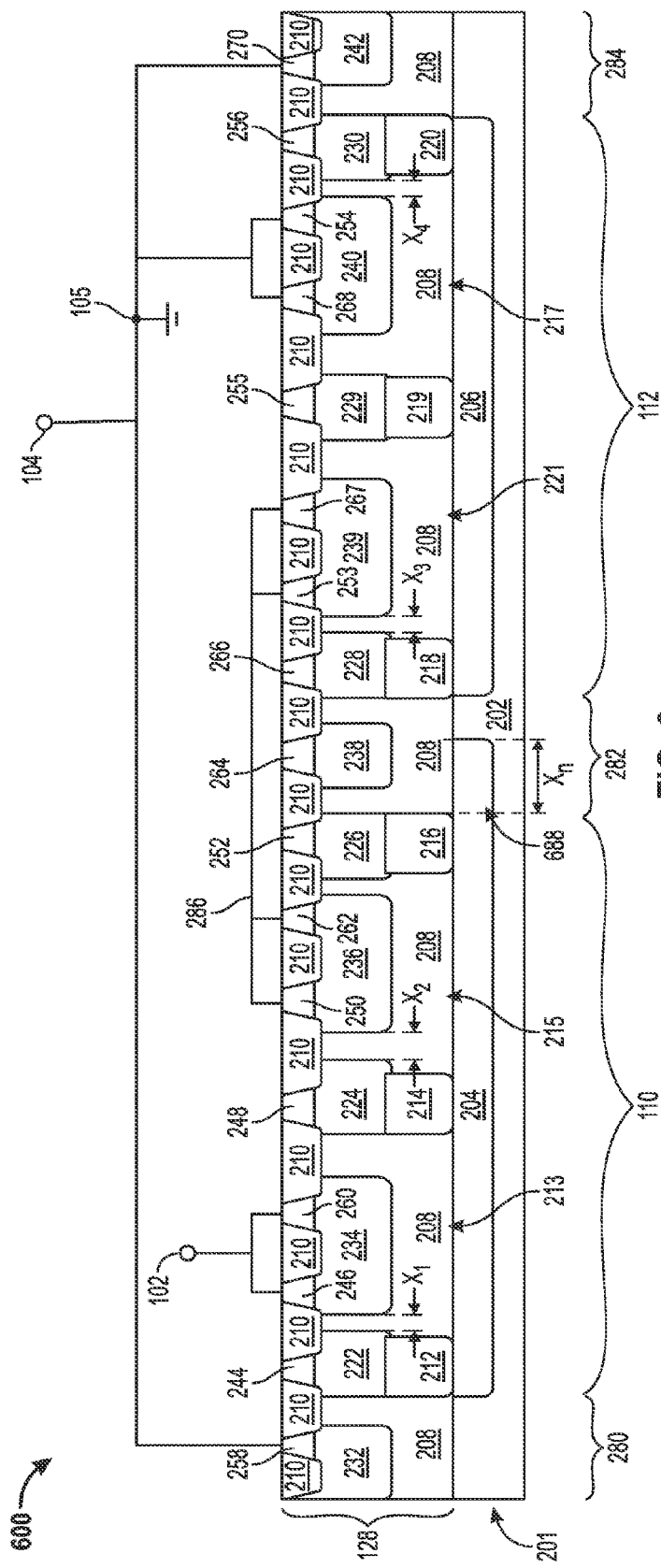
FIG. 6 depicts a cross-sectional view of another semiconductor device structure suitable for use as the stacked protection arrangement in the electronic device of FIG. 1 in accordance with one or more embodiments of the invention.

FIG. 6 illustrates, in cross-section, another embodiment of a semiconductor device structure 600 suitable for use as the stacked protection arrangement 108 in the electronic device 100 of FIG. 1. In the embodiment of FIG. 6, the auxiliary diode element 128 is formed by an extending portion 688 of the buried region 204 that extends laterally beyond the inner lateral boundaries of the vertical collector regions 216, 226 into the central substrate region 282 that resides between the protection circuitry arrangements 110, 112. Similar to FIG. 2, the breakdown voltage of the diode element 128 is dictated by the distance ($x_n$) by which the extending portion 688 extends beyond the vertical collector regions 216, 226 and decreases as the amount of overlap of the extending portion 688 underneath the P-well region 238 and the contact region 264 increases. Depending on the embodiment, the contact region 264 may be electrically connected to the lower voltage terminal 104, either directly or indirectly via one or more contiguous regions that are electrically connected to the substrate contact regions 258, 270. Additionally, in the embodiment of FIG. 6, the emitter region 250 of the second BJT 122 is disposed between the base contact region 262 and the central collector regions 214, 224, 248 to reduce the susceptibility to latchup resulting from breakdown of the auxiliary diode element 128, in a similar manner as described above in the context of FIG. 5. In this regard, the distance ($x_2$) between a lateral boundary of the N-well region 224 proximate the emitter region 250 and the proximal lateral boundary of P-well region 236 dictates the collector-to-base avalanche breakdown voltage that generates carriers and then turns on (or triggers) the BJT 122 in the forward direction, and the distance ($x_2$) may be tuned to achieve a desired breakdown performance.

It should be noted that although FIG. 6 depicts the auxiliary diode element 128 being formed by extending the buried region 204 into the central substrate shunt region 282, in alternative embodiments, the auxiliary diode element 128 may be formed by extending either of the sinker region 216 or the well region 226 into the central substrate shunt region 282 in lieu of extending the buried region 204, in a similar manner as described above with respect to the corresponding regions 212, 222 in the context of FIGS. 3-4.

FIGS. 7-11 illustrate, in cross-section, an exemplary fabrication process that may be performed to fabricate the protection device structure 200 of FIG. 2 suitable for use as the stacked protection arrangement 108 in the electronic device 100 of FIG. 1 in accordance with one or more exemplary embodiments. Various steps in the manufacture of semiconductor devices are well known and so, in the interest of brevity, many conventional steps will only be mentioned briefly herein or will be omitted entirely without providing the well-known process details. Furthermore, it should be appreciated that although the subject matter may be described herein in the context of NPN BJT elements, the subject matter is not intended to be limited to NPN BJT elements and may be implemented in an equivalent manner for PNP BJT elements (e.g., by interchanging the conductivities of the doped regions). Additionally, it should be understood that the protection devices and the fabrication processes described herein are not constrained by the substrate of semiconductor material utilized, and the fabrication process described herein may also be used to create protection devices on a silicon-on-insulator (SOI) semiconductor substrate. Thus, while the subject matter may be described in the context of epitaxial fabrication processes, alternative embodiments of the protection devices and the fabrication processes described herein may not involve the epitaxial fabrication processes described herein. Additionally, it should be appreciated that the fabrication process steps described herein need not be performed in the illustrated order, and that the ordering of certain fabrication process steps described herein may be interchanged and still result in substantially the same protection device structure.

While FIGS. 7-11 only depict fabrication of the first protection circuitry arrangement 110 and the diode region 280 of the protection device structure 200 for clarity and ease of explanation, it will be appreciated that the second protection circuitry arrangement 112 and substrate shunt regions 282, 284 of the protection device structure 200 may be fabricated concurrently therewith in a substantially similar manner as described herein. Moreover, the fabrication processes described here in the context of FIGS. 7-11 with respect to the protection device structure 200 of FIG. 2 may also be utilized in an equivalent manner to fabricate any one of the other protection device structures 300, 400, 500, 600 described above in the context of FIGS. 3-6 by modifying the ion implantation masks in an appropriate manner.

Figure 7:
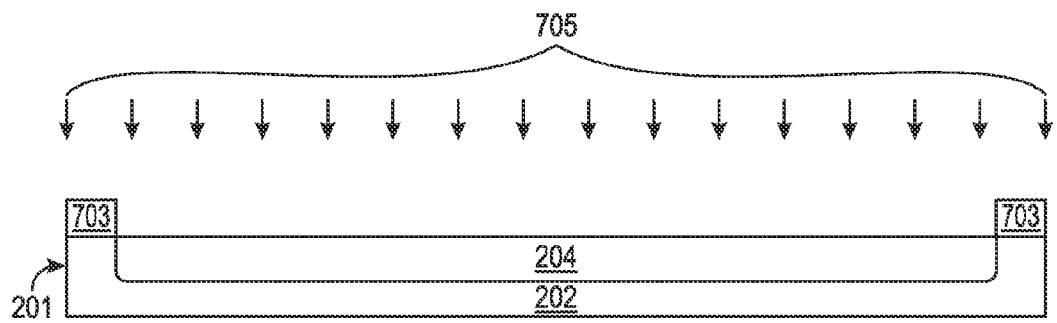
FIGS. 7-11 illustrate, in cross section, exemplary methods for fabricating the semiconductor device structure of FIG. 2 in accordance with one embodiment of the invention.

Referring now to FIG. 7, in exemplary embodiments, the protection device structure 200 is fabricated on a semiconductor substrate 201 that includes a layer of semiconductor material 202. As described in greater detail below, in exemplary embodiments, the layer of semiconductor material 202 is utilized to epitaxially grow additional semiconductor material thereon, and accordingly, for convenience, but without limitation, the layer of semiconductor material 202 may alternatively be referred to herein as the seed layer. In an exemplary embodiment, the semiconductor material 202 is realized as a silicon material, wherein the term "silicon material" is used herein to encompass the relatively pure silicon materials typically used in the semiconductor industry as well as silicon admixed with other elements such as germanium, carbon, and the like. Alternatively, the semiconductor material 202 may be realized as germanium, gallium arsenide, gallium nitride, and the like, and/or one may include layers of different semiconductor materials. In exemplary embodiments, the substrate semiconductor material 202 is lightly doped. For example, the substrate semiconductor material 202 may be realized as a P-type silicon material having a P-type dopant concentration in the range of about $1\times10^{15}/cm^3$ to about $8\times10^{15}$ cm$^3$.

Fabrication of the protection device structure 200 continues with masking portions of the protection device structure 200 to be utilized for the diode and substrate shunt regions 280, 282, 284 and forming the doped regions 204, 206 of semiconductor material within the substrate semiconductor material 202. The doped regions 204, 206 having a conductivity type that is opposite the conductivity of the substrate semiconductor material 202, and the doped regions 204, 206 are formed by masking the protection device structure 200 with a masking material 703, such as a photoresist material, that is patterned to provide an implantation mask that exposes the portions of the substrate semiconductor material 202 to be used for the doped regions 204, 206. The doped regions 204, 206 are then formed by implanting N-type ions, such as antimony ions or phosphorous ions, illustrated by arrows 705, in the substrate semiconductor material 202 with a dopant concentration in the range of about $1\times10^{18}/cm^3$ to about $1\times10^{19}/cm^3$ at an energy level in the range of about 50 kiloelectron volts (keV) to about 2000 keV so that the depths of the doped regions 204, 206 (after subsequent thermal annealing or any other diffusion) are in the range of about 0.5 to about 10 microns.

Figure 8:
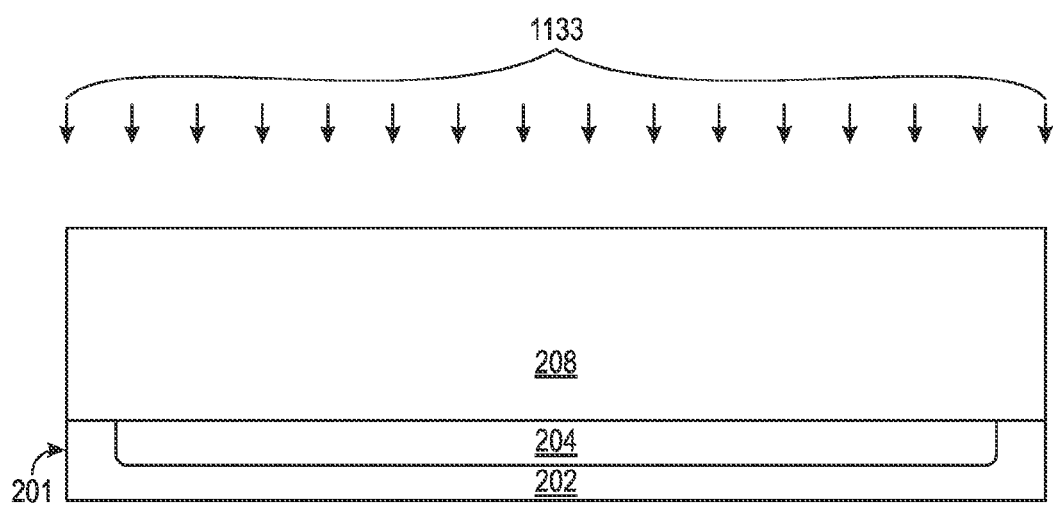

Referring now to FIG. 8, after forming the doped regions 204, 206, fabrication of the protection device structure 200 continues by removing the masking material 703 and forming or otherwise providing another doped layer of semiconductor material 208 overlying the doped regions 204, 206, with the doped layer 208 being formed to a desired thickness with a conductivity type opposite the doped regions 204, 206. For example, a P-type epitaxial layer 208 may be formed by epitaxially growing silicon material on the substrate semiconductor material 202 and in-situ doping the silicon material by adding boron ions (or other P-type ions) to the reactants used to epitaxially grow the layer 208. In one or more embodiments, the epitaxial layer 208 has a P-type dopant concentration in the range of about $1\times10^{15}/cm^3$ to about $8\times10^{15}/cm^3$. In an exemplary embodiment, the epitaxial layer 208 is grown to a thickness in the range of about 0.5 microns to about 10 microns, which may vary depending on the needs of a particular application. It should be understood that the protection devices and the fabrication processes described herein are not constrained by the manner in which the doped regions 204, 206 and/or P-type layer 208 are formed, and the protection device structure 200 illustrated in FIG. 8 may be fabricated or otherwise achieved in a variety of alternative manners (e.g., the P-type layer 208 does not necessarily need to be realized as an epitaxial layer and does not necessarily need to be epitaxially grown and/or in-situ doped, the doped regions 204, 206 do not necessarily need to be formed by ion implantation, etc.). The doped regions 204, 206 may alternatively be referred to herein as buried regions, in that they are physically separated from the surface of the semiconductor substrate 201 by at least a portion of the overlying epitaxial layer 208.

Figure 9:
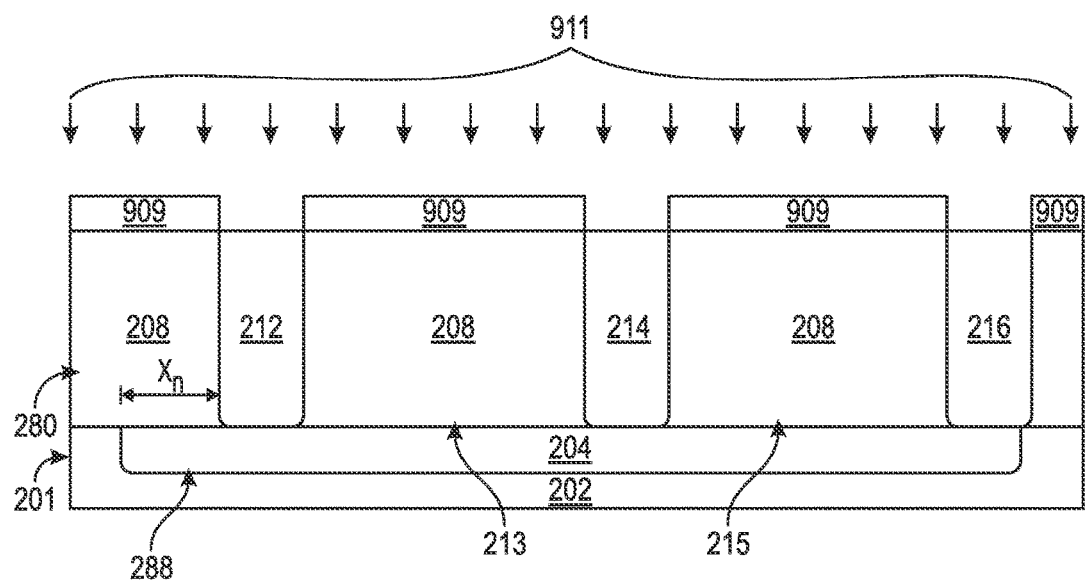

Turning now to FIG. 9, after forming the epitaxial layer 208, the fabrication process continues by masking portions of the epitaxial layer 208 and forming doped sinker regions 212, 214, 216, 218, 219, 220 of semiconductor material having the opposite conductivity type within the epitaxial layer 208. The doped sinker regions 212, 214, 216, 218, 219, 220 are formed by masking the protection device structure 200 with a masking material 909 that is patterned to provide an implantation mask that exposes portions of the epitaxial layer 208 to be used for the sinker regions 212, 214, 216, 218, 219, 220 while masking the remaining portions to be used for the base regions of BJTs 120, 122, 124, 126 and the diode and substrate shunt regions 280, 282, 284. After patterning the implantation mask 209, N-type sinker regions 212, 214, 216, 218, 219, 220 may be formed by implanting N-type ions, such as phosphorous ions or arsenic ions, illustrated by arrows 911, in the epitaxial layer 208 with a dopant concentration in the range of about $1\times10^{16}/cm^3$ to about $1\times10^{19}/cm^3$, and more preferably within the range of about $1\times10^{17}/cm^3$ to about $8\times10^{18}/cm^3$, at an energy level in the range of about 50 keV to about 3000 keV to provide N-type sinker regions 212, 214, 216, 218, 219, 220 with a depth (after subsequent thermal annealing or any other diffusion) corresponding to the thickness of the epitaxial layer 208 so that the N-type sinker regions 212, 214, 216, 218, 219, 220 extend to and abut the N-type buried regions 204, 206. In this manner, the N-type sinker regions 212, 214, 216 are electrically connected to the N-type buried region 204 to provide the common (or integral) collector electrodes for the BJTs 120, 122 and the N-type sinker regions 218, 219, 220 are electrically connected to the N-type buried region 206 to provide the common (or integral) collector electrodes for the BJTs 124, 126. As illustrated, the N-type sinker regions 212, 214, 216, 218, 219, 220 partition the P-type epitaxial layer 208 into separate P-type regions 213, 215, 217, 221 having a respective BJT element 120, 122, 126, 124 fabricated therein. In this regard, N-type sinker regions 212, 216 define the lateral boundaries of the first protection circuitry arrangement 110 while sinker region 214 separates the base regions 213, 215 of the adjacent BJTs 120, 122, and sinker regions 218, 220 define the lateral boundaries of the second protection circuitry arrangement 112 while sinker region 219 separates the base regions 217, 221 of the adjacent BJTs 124, 126.

As illustrated, for the embodiments of FIG. 2 and FIG. 5, the implant mask 909 is inwardly offset from a peripheral lateral boundary of the buried region 204 by distance ($x_n$) to define the diode region 280 that includes an extending portion 288 of the buried region 204. Alternatively, for the embodiment of FIG. 6, the implant mask 909 is offset from an inner lateral boundary of the buried region 204 by distance ($x_n$) to form the diode element 128 within the central substrate shunt region 282 that includes an extending portion 688 of the buried region 204. In other alternative embodiments, such as the protection device structure 300 of FIG. 3, the implant mask 909 is outwardly offset from a peripheral lateral boundary of the buried region 204 by distance ($x_r$) to define the diode region 280 that includes an extending portion 388 of the sinker region 212 that extends beyond the peripheral lateral boundary of the buried region 204. In yet other embodiments, such as the embodiment of FIG. 4, the implant mask 909 may be aligned with the lateral boundaries of the buried region 204 so that the lateral boundaries of the sinker regions 212, 216 that define the first protection circuitry arrangement 110 are vertically aligned with the lateral boundaries of the buried region 204.

The illustrated fabrication process continues by forming shallow isolation regions of dielectric material 210 (FIG. 10) that laterally isolate subsequently formed neighboring contact regions. In this regard, shallow isolation regions of a dielectric material 210, such as an oxide material, are formed in the upper portions of the substrate 201 by performing shallow trench isolation (STI). To form the shallow isolation regions, portions of the protection device structure 200 are masked with a masking material that is patterned to expose the desired portions of the epitaxial layer 208, which are then etched to a desired depth (which is less than the thickness of the epitaxial layer 208) to form trenches, which are then filled with the dielectric material 210, for example, by performing a deposition process followed by a planarization process. In accordance with one or more exemplary embodiments, the depth of the dielectric material 210 in the shallow isolation regions is in the range of about 0.05 microns to about 1 micron, and more preferably, within the range of 0.2 microns to 0.5 microns.

Figure 10:
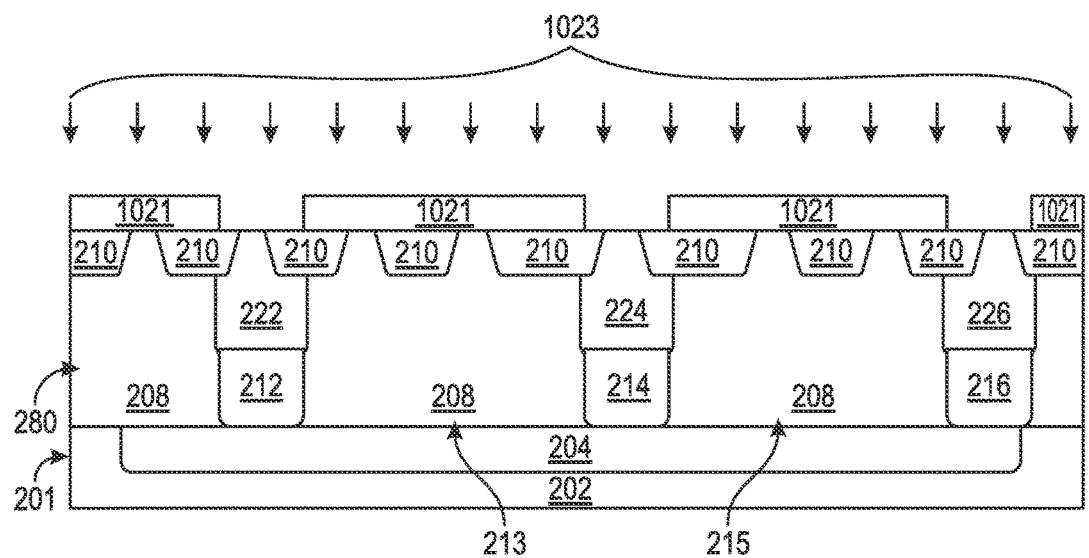

Referring to FIG. 10, in exemplary embodiments, the fabrication process continues by forming N-type well regions 222, 224, 226, 228, 229, 230 either within the N-type sinker regions 212, 214, 216, 218, 219, 220 or otherwise extending into and/or partially overlapping the N-type sinker regions 212, 214, 216, 218, 219, 220. The N-well regions 222, 224, 226, 228, 229, 230 are formed by masking the protection device structure 200 with a masking material 1021 that is patterned to provide an implantation mask that exposes the sinker regions 212, 214, 216, 218, 219, 220 while the remaining masking material 1021 masks interior portions of the P-type epitaxial regions 213, 215, 217, 221 and the P-type diode and substrate shunt regions 280, 282, 284. In the illustrated embodiment, lateral edges of the implantation mask may be offset from the lateral boundaries of the P-type epitaxial regions 213, 215, 217, 221 with a respective sinker region 212, 216, 218, 220 so that the subsequently formed N-well regions 222, 226, 228, 230 extend laterally into the respective P-type epitaxial region 213, 215, 217, 221 towards a subsequently formed base well region 234, 236, 239, 240 from a respective sinker region 212, 216, 218, 220. In other words, the lateral width of a respective N-well region 222, 226, 228, 230 may be greater than the lateral width of the respective N-type sinker region 212, 216, 218, 220 that respective N-well region 222, 226, 228, 230 is formed overlying. In other embodiments, the boundaries of the N-well regions 222, 224, 226, 228, 229, 230 may be vertically aligned with the N-type sinker regions 212, 214, 216, 218, 219, 220, that is, the lateral width of a respective N-well region 222, 224, 226, 228, 229, 230 is substantially equal to the lateral width of the respective N-type sinker region 212, 214, 216, 218, 219, 220 that respective N-well region 222, 224, 226, 228, 229, 230 is formed within. It should be noted that for the embodiments of FIG. 4, the implant mask 1021 may be outwardly offset from the peripheral lateral boundary of the underlying sinker region 212 by some nonzero distance to define the diode region 280 that includes an extending portion 488 of the well region 222 that extends beyond the peripheral lateral boundaries of the underlying buried and sinker regions 204, 212.

After forming the implantation mask 1021, the N-well regions 222, 224, 226, 228, 229, 230 are formed by implanting N-type ions, such as phosphorous ions or arsenic ions, illustrated by arrows 1023, in the epitaxial layer 208 with a dopant concentration preferably within the range of about $1 \times 10^{16}/cm^3$ to about $1 \times 10^{19}/cm^3$, and at an energy level in the range of about 50 keV to about 2000 keV to provide the N-well regions 222, 224, 226, 228, 229, 230 with a depth (after subsequent thermal annealing or any other diffusion) that is greater than a depth of the shallow isolation regions 210 but less than a depth of the N-type sinker regions 212, 214, 216, 218, 219, 220. In accordance with one or more exemplary embodiments, the depth of the N-well regions 222, 224, 226, 228, 229, 230 may be greater than 0.3 microns. In exemplary embodiments, the dopant concentration of the N-well regions 222, 224, 226, 228, 229, 230 is less than or equal to the dopant concentration of the N-type sinker regions 212, 214, 216, 218, 219, 220, however, in alternative embodiments, the dopant concentration of the N-well regions 222, 224, 226, 228, 229, 230 may be greater than the dopant concentration of the N-type sinker regions 212, 214, 216, 218, 219, 220. In one alternative embodiment, the N-well regions 222, 224, 226, 228, 229, 230 and the N-type sinker regions 212, 214, 216, 218, 219, 220 are formed concurrently as part of the same implantation process.

Figure 11:
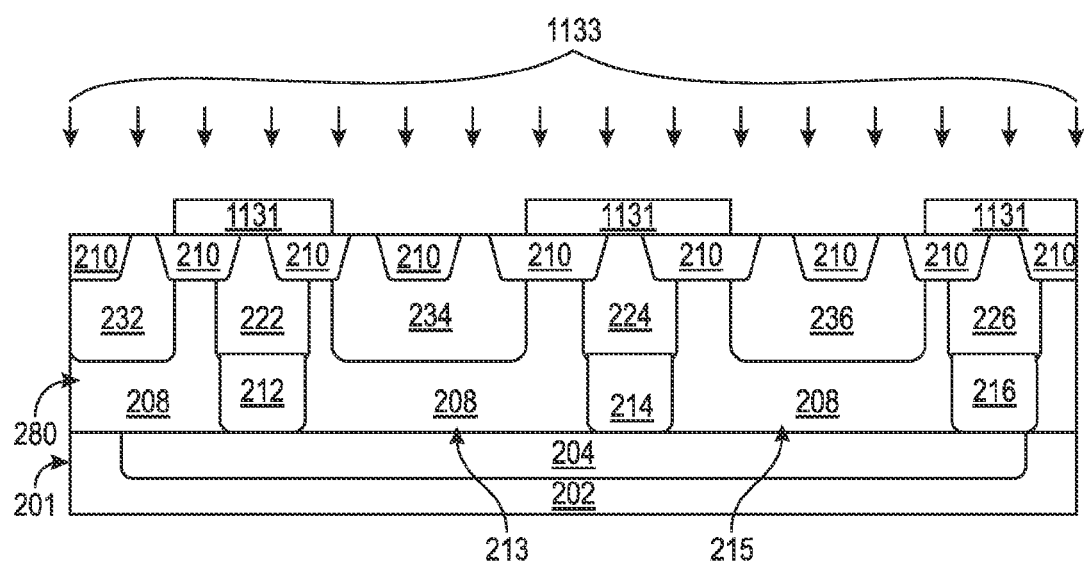

Turning now to FIG. 11, after forming the N-well regions 222, 224, 226, 228, 229, 230, fabrication of the protection device structure 200 continues by masking the N-well regions 222, 224, 226, 228, 229, 230 and forming P-type well regions 232, 234, 236, 238, 239, 240, 242 in the interior portions of the P-type epitaxial regions 213, 215, 217, 221 and the P-type diode and substrate shunt regions 280, 282, 284. The P-well regions 234, 236, 239, 240 function as a relatively higher doped portion of the base electrode of a respective BJT element 120, 122, 124, 126 that surrounds or otherwise encompasses the emitter electrode of that respective BJT element 120, 122, 124, 126. In this regard, the P-well regions 234, 236, 239, 240 are formed within the respective transistor regions 213, 215, 217, 221 proximate the N-well collector regions 222, 226, 228, 230 so that the portion of the relatively lighter doped epitaxial region 213, 215, 217, 221 residing between a lateral boundary of a respective N-well collector region 222, 226, 230 and the proximal lateral boundary of a respective P-well region 234, 236, 240 dictates the avalanche breakdown voltage across the collector-base junction before the resulting electrical potential of the base forward-biases the base-emitter junction and turns on or triggers a respective BJT 120, 122, 126. In other words, the distance ($x_2$) between a lateral boundary of the N-well region 226 and the proximal lateral boundary of P-well region 236 dictates the collector-to-base avalanche breakdown voltage that generates carriers and then turns on (or triggers) the BJT 122 in the forward direction, and similarly, the distance ($x_4$) between a lateral boundary of the N-well region 230 and the proximal lateral boundary of P-well region 240 dictates the collector-to-base avalanche breakdown voltage that generates carriers and then turns on (or triggers) the BJT 126 in the forward direction. Conversely, the distance ($x_1$) between a lateral boundary of N-well region 222 and the proximal lateral boundary of P-well region 234 dictates the collector-to-base avalanche breakdown voltage that generates carriers and then turns on (or triggers) the BJT 120 in the reverse direction. In the illustrated embodiment, the P-well regions 234, 236, 240 are spaced apart from the collector well regions 222, 226, 230 by a nonzero lateral separation distance, wherein at least a portion of a respective lighter doped P-type epitaxial region 213, 215, 217 remains intact laterally between the lateral boundary of a respective P-well region 234, 236, 240 formed therein and the proximal lateral boundary of a respective collector well region 222, 226, 230. In one or more exemplary embodiments, the lateral separation distance between a lateral boundary of a respective P-well region 234, 236, 239, 240 and the proximal lateral boundary of a respective collector well region 222, 226, 228, 230 is less than ten microns. In some embodiments, a respective P-well region 234, 236, 239, 240 may abut, and in some cases overlap a lateral boundary of, a respective collector well region 222, 226, 228, 230.

To fabricate P-well regions 232, 234, 236, 238, 239, 240, 242, the protection device structure 200 is masked with a masking material 1131 that is patterned to provide an implantation mask that exposes interior portions of the P-type epitaxial regions 213, 215, 217, 221 and the P-type diode and substrate shunt regions 280, 282, 284 while masking the N-well regions 222, 224, 226, 228, 229, 230 and the portions of the epitaxial layer 208 between the P-well regions 232, 234, 236, 238, 239, 240, 242 and the respective neighboring collector regions 222, 224, 226, 228, 229, 230. Lateral edges of the implantation mask 1131 are offset from lateral boundaries of the shallow isolation regions 210 adjacent to the respective N-well regions 222, 224, 226, 228, 229, 230 to expose portions of those shallow isolation regions 210 so that the subsequently formed P-well regions 232, 234, 236, 238, 239, 240, 242 extend laterally beneath the shallow isolation regions 210. The P-well regions 232, 234, 236, 238, 239, 240, 242 are then formed by implanting P-type ions, such as boron ions, illustrated by arrows 1133, in the exposed portions of the epitaxial layer 208 with a dopant concentration that is greater than the dopant concentration of the P-type epitaxial layer 208, preferably within the range of $1\times10^{17}/cm^3$ to about $1\times10^{19}/cm^3$, and more preferably about $1\times10^{18}/cm^3$ to about $8\times10^{18}/cm^3$, and at an energy level in the range of about 50 keV to about 1500 keV to provide the P-well regions 232, 234, 236, 238, 239, 240, 242 with a depth (after subsequent thermal annealing or any other diffusion) that is greater than a depth of the shallow isolation regions 210. In accordance with one or more exemplary embodiments, the depth of the P-well regions 232, 234, 236, 238, 239, 240, 242 is greater than 0.3 microns. In exemplary embodiments, the depth of the P-well regions 232, 234, 236, 238, 239, 240, 242 is less than the thickness of the epitaxial layer 208, so that at least a portion of the lighter doped P-type epitaxial layer 208 remains vertically between the P-well regions 232, 234, 236, 238, 239, 240, 242 and the N-type buried regions 204, 206.

It should be noted that for the embodiment of FIG. 2, the anode well region 232 is formed to a desired depth and spaced apart from the neighboring collector well region 222 and collector sinker region 212 by a distance that ensures breakdown of the diode element 128 occurs between the lower boundary of the anode well region 232 and the underlying cathode portion 288 before breakdown occurs between the anode well region 232 and one of the vertical collector regions 212, 222. For the embodiment of FIG. 3, the depth of the anode well region 232 and the separation distance between the anode well region 232 and the collector sinker region 212 is configured to ensure breakdown of the diode element 128 occurs between the anode well region 232 and the cathode sinker region 212 before breakdown occurs between the anode well region 232 and one of the other collector regions 204, 222, and in some embodiments, at least a portion of a boundary of the anode well region 232 may abut at least a portion of the collector sinker region 212. Similarly, for the embodiment of FIG. 4, the depth of the anode well region 232 and the separation distance between the anode well region 232 and the collector well region 212 is configured to ensure breakdown of the diode element 128 occurs between the anode well region 232 and the collector well region 222 before breakdown occurs between the anode well region 232 and one of the other collector regions 204, 212, and in some embodiments, at least a portion of a boundary of the anode well region 232 may abut at least a portion of the collector well region 222, with the diode breakdown voltage being tuned using (or dictated by) the respective dopant concentrations of the regions 222, 232.

After forming the P-well regions 232, 234, 236, 238, 239, 240, 242 the fabrication process continues by appropriately masking the protection device structure 200, forming shallow N-type contact regions 244, 246, 248, 250, 252, 253, 254, 256, 266 within the P-type base well regions 234, 236, 239, 240 and the N-type collector well regions 222, 224, 226, 228, 229, 230, and forming shallow P-type contact regions 258, 260, 262, 264, 267, 268, 270 within the P-well regions 232, 234, 236, 238, 239, 240, 242. In this regard, each of the N-type contact regions 246, 250, 253, 254 functions as a relatively higher doped emitter electrode for a respective BJT 120, 122, 124, 126, each of the N-type contact regions 244, 248, 252, 256 functions as a relatively higher doped collector electrode contact region for the collector of a respective BJT 120, 122, 124, 126, and each of the P-type regions 260, 262, 267, 268 functions as a relatively higher doped base electrode contact region for a respective BJT 120, 122, 124, 126. The P-type contact region 258 formed within the P-type anode well region 232 functions as the anode contact of the auxiliary diode 128, while P-type contact regions 264, 270 function as contacts for the substrate shunt regions 282, 284. In one or more exemplary embodiments, the contact regions have a dopant concentration in the range of about $1 \times 10^{19}/cm^3$ to about $1 \times 10^{21}/cm^3$, and a depth (after diffusion) that is less than a depth of the shallow isolation regions 210, and also, less than the depth of the well regions they are formed within.

After forming the shallow N-type and P-type contact regions, fabrication of the protection device structure 200 may be completed by forming contacts on the contact regions, providing electrical connections between the respective base and emitter electrodes of the respective BJTs 120, 122, 124, 126, providing an electrical connection 286 between the electrically connected base and emitter electrodes of the BJT 122 and the electrically connected base and emitter electrodes of the BJT 124, and providing electrical connections to/from the electrically connected base and emitter electrodes of the respective BJTs 120, 126 and a respective physical interface 102, 104 of the electronic device 100. Additionally, electrical connections are provided from the substrate contact regions 258, 264, 270 to a node 105 configured to receive a reference voltage for the substrate 201, which, in the illustrated embodiment, is electrically connected to the terminal 104 of the device 100. To provide the electrical connections, after the contacts are formed, one or more layers of dielectric material (e.g., an interlayer dielectric material) may be formed overlying the protection device structure 200, and portions of the dielectric material overlying the contacts regions may be removed to expose their overlying contacts. Vias or contact plugs may be formed overlying the contacts, and one or more overlying layers of conductive material may be patterned, routed, or otherwise formed to provide direct electrical connections between the base and emitter electrodes of the respective BJTs 120, 122, 124, 126, thereby effectively short-circuiting the base and emitter of each respective BJTs 120, 122, 124, 126 together, as well as provide direct electrical connections to/from the BJTs 120, 126, the anode regions 232, 258 of the diode element 128, and the substrate contacts 264, 270 from/to the appropriate physical interfaces 102, 104 of the device 100.

For the sake of brevity, conventional techniques related to semiconductor and/or integrated circuit fabrication, ESD protection schemes, and other functional aspects of the subject matter may not be described in detail herein. In addition, certain terminology may be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An apparatus for a protection circuit is provided in one embodiment. The protection circuit comprises a first protection arrangement that includes a first transistor having a first collector, a first emitter, and a first base coupled to the first emitter at a first node, and a second transistor having a second collector, a second emitter, and a second base coupled to the second emitter at a second node. The second collector is coupled to the first collector at a third node. A second protection arrangement is coupled electrically in series between the second node and a fourth node, and a first diode is coupled between the third node and the fourth node. In one or more embodiments, the first diode comprises a cathode coupled to the third node and an anode coupled to the fourth node, and the cathode and the first collector are integral. In one embodiment, the first diode comprises a cathode coupled to the third node and an anode coupled to the fourth node, wherein the second protection arrangement comprises a third transistor having a third collector, a third emitter, and a third base coupled to the third emitter at the second node, and a fourth transistor having a fourth collector coupled to the third collector, a fourth emitter, and a fourth base coupled to the fourth emitter at the fourth node. In another embodiment, a breakdown voltage of the first diode is less than a sum of a first transient breakdown voltage of the second transistor and a second transient breakdown voltage of the second protection arrangement. In yet another embodiment, a breakdown voltage of the first diode is greater than a sum of a first holding voltage of the first protection arrangement and a second holding voltage of the second protection arrangement. In another embodiment, the first protection arrangement has a first triggering voltage and the second protection arrangement has a second triggering voltage, wherein a breakdown voltage of the first diode is less than a sum of the first triggering voltage and the second triggering voltage. In one embodiment, the protection circuit further comprises a first interface coupled to the first node and a second interface coupled to the fourth node, wherein the first interface comprises a higher voltage terminal and the second interface comprises a lower voltage terminal.

In another embodiment, an apparatus for a semiconductor device is provided. The semiconductor device comprises a first protection arrangement coupled between a first node and a second node and a second protection arrangement coupled electrically in series between the second node and a third node. The first protection arrangement comprises a first collector region of semiconductor material having a first conductivity type, and the semiconductor device includes a first region of semiconductor material having a second conductivity type opposite the first conductivity type. The first region is coupled to the third node and a breakdown voltage between the first collector region and the first region is less than a sum of a first breakdown voltage between the first collector region and the second node and a second breakdown voltage of the second protection arrangement. In one embodiment, the semiconductor device further comprises a diode region adjacent to the first protection arrangement, wherein the first region comprises an anode region within the diode region, the diode region includes an extending portion of the first collector region, and the breakdown voltage between the extending portion and the anode region is less than the sum of the first breakdown voltage and the second breakdown voltage. In a further embodiment, the first collector region comprises a buried region of semiconductor material, and the first protection arrangement comprises a base well region having the second conductivity type overlying the buried region. In another embodiment, the first protection arrangement comprises a base well region having the second conductivity type, and the first collector region comprises a sinker region of semiconductor material residing laterally between the base well region and the diode region. In another embodiment, the first protection arrangement comprises a base well region having the second conductivity type, and the first collector region comprises a collector well region of semiconductor material residing laterally between the base well region and the diode region. In yet another embodiment, the semiconductor device further comprises a diode region adjacent to the first protection arrangement, wherein the first protection arrangement comprises a first base well region having the second conductivity type, a second base well region having the second conductivity type, a first collector well region having the first conductivity type residing laterally between the first base well region and the second base well region, base contact region having the second conductivity type within the first base well region, and an emitter contact region having the first conductivity type within the first base well region. The first collector well region is electrically coupled to the first collector region, the emitter contact region resides laterally between the base contact region and the first collector well region, the base contact region resides laterally between the emitter contact region and the diode region, and the base contact region and the emitter contact region are electrically connected at the first node. In yet another embodiment, the semiconductor device further comprises a diode region adjacent to the first protection arrangement, wherein the first protection arrangement comprises a first base well region having the second conductivity type, a first base contact region having the second conductivity type within the first base well region, a first emitter contact region having the first conductivity type within the first base well region, a second base well region having the second conductivity type, a second base contact region having the second conductivity type within the second base well region, a second emitter contact region having the second conductivity type within the second base well region, and a first collector well region having the first conductivity type. The first base contact region and the first emitter contact region are electrically connected at the first node, the second base contact region and the second emitter contact region are electrically connected at the second node, and the first collector well region resides laterally between the second base well region and the diode region.

In yet another embodiment, a method of fabricating an electronic device is provided. The method comprises forming a first protection circuitry arrangement on a substrate, the first protection circuitry arrangement comprising a first transistor element and a second transistor element formed on the substrate, forming a second protection circuitry arrangement on the substrate, forming a diode element adjacent to the first protection circuitry arrangement, providing a first electrical connection between the first protection circuitry arrangement and a first device terminal, and providing a second electrical connection between the third node and a second device terminal. A first collector of the first transistor element is coupled to a second collector of the second transistor element at a first node, the second protection circuitry arrangement is coupled to the second transistor element at a second node, the second protection circuitry arrangement is electrically in series between the second node and a third node, a cathode of the diode element is electrically connected to the first collector at the first node, and an anode of the diode element is electrically connected to the third node. In one embodiment, forming the diode element comprises forming the cathode in the substrate adjacent to the first collector and forming the anode in the substrate spaced apart from the cathode by a separation distance that results in a breakdown voltage between the cathode and the anode that is less than a sum of a first breakdown voltage of the second transistor element and a second breakdown voltage of the second protection circuitry arrangement. In a further embodiment, forming the cathode comprises forming a portion of the first collector that laterally extends towards the anode. In yet another embodiment, forming the diode element comprises forming the cathode in the substrate adjacent to the first collector and forming the anode in the substrate spaced apart from the first collector by a separation distance that results in a breakdown voltage between the cathode and the anode that is less than a sum of a first breakdown voltage of the second transistor element and a second breakdown voltage of the second protection circuitry arrangement.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A protection circuit comprising:
   a first protection arrangement comprising:
      a first transistor having a first collector, a first emitter, and a first base coupled to the first emitter at a first node; and
      a second transistor having a second collector, a second emitter, and a second base coupled to the second emitter at a second node, the second collector being coupled to the first collector at a third node;
   a second protection arrangement coupled electrically in series between the second node and a fourth node; and
   a first diode coupled between the third node and the fourth node, wherein a breakdown voltage of the first diode is less than a sum of a first transient breakdown voltage of the second transistor and a second transient breakdown voltage of the second protection arrangement.

2. The protection circuit of claim 1, wherein the first diode comprises a cathode coupled to the third node and an anode coupled to the fourth node.

3. The protection circuit of claim 2, wherein the cathode and the first collector are integral.

4. The protection circuit of claim 2, wherein the second protection arrangement comprises:
   a third transistor having a third collector, a third emitter, and a third base coupled to the third emitter at the second node; and a fourth transistor having a fourth collector coupled to the third collector, a fourth emitter, and a fourth base coupled to the fourth emitter at the fourth node.

5. The protection circuit of claim 1, wherein the breakdown voltage of the first diode is greater than a sum of a first holding voltage of the first protection arrangement and a second holding voltage of the second protection arrangement.

6. The protection circuit of claim 1, the first protection arrangement having a first triggering voltage, wherein the breakdown voltage of the first diode is less than a sum of the first triggering voltage and the second transient breakdown voltage.

7. The protection circuit of claim 1, further comprising:
a first interface coupled to the first node; and
a second interface coupled to the fourth node.

8. The protection circuit of claim 7, wherein:
the first interface comprises a higher voltage terminal; and
the second interface comprises a lower voltage terminal.

9. The protection circuit of claim 1, wherein the first diode conducts at least a portion of a discharge current during a period of time before the second protection arrangement is turned on.

10. The protection circuit of claim 9, wherein the first diode stops conducting once the second protection arrangement is turned on.

11. A semiconductor device comprising:
a first protection arrangement coupled between a first node and a second node, the first protection arrangement including a first collector region of semiconductor material having a first conductivity type;
a second protection arrangement coupled electrically in series between the second node and a third node; and
a first region of semiconductor material having a second conductivity type opposite the first conductivity type, wherein:
the first region is coupled to the third node; and
a breakdown voltage between the first collector region and the first region is less than a sum of a first breakdown voltage between the first collector region and the second node and a second breakdown voltage of the second protection arrangement.

12. The semiconductor device of claim 11, further comprising a diode region adjacent to the first protection arrangement, wherein:
the first region comprises an anode region within the diode region;
the diode region includes an extending portion of the first collector region; and
the breakdown voltage between the extending portion and the anode region is less than the sum of the first breakdown voltage and the second breakdown voltage.

13. The semiconductor device of claim 12, wherein:
the first collector region comprises a buried region of semiconductor material; and
the first protection arrangement comprises a base well region having the second conductivity type overlying the buried region.

14. The semiconductor device of claim 12, wherein:
the first protection arrangement comprises a base well region having the second conductivity type; and
the first collector region comprises a sinker region of semiconductor material residing laterally between the base well region and the diode region.

15. The semiconductor device of claim 12, wherein:
the first protection arrangement comprises a base well region having the second conductivity type; and
the first collector region comprises a collector well region of semiconductor material residing laterally between the base well region and the diode region.

16. The semiconductor device of claim 11, further comprising a diode region adjacent to the first protection arrangement, wherein:
the first protection arrangement comprises:
a first base well region having the second conductivity type,
a second base well region having the second conductivity type,
a first collector well region having the first conductivity type residing laterally between the first base well region and the second base well region,
a base contact region having the second conductivity type within the first base well region, and
an emitter contact region having the first conductivity type within the first base well region;
the first collector well region is electrically coupled to the first collector region;
the emitter contact region resides laterally between the base contact region and the first collector well region;
the base contact region resides laterally between the emitter contact region and the diode region; and
the base contact region and the emitter contact region are electrically connected at the first node.

17. The semiconductor device of claim 11, further comprising a diode region adjacent to the first protection arrangement, wherein:
the first protection arrangement comprises:
a first base well region having the second conductivity type,
a first base contact region having the second conductivity type within the first base well region,
a first emitter contact region having the first conductivity type within the first base well region,
a second base well region having the second conductivity type,
a second base contact region having the second conductivity type within the second base well region,
a second emitter contact region having the second conductivity type within the second base well region, and
a first collector well region having the first conductivity type;
the first base contact region and the first emitter contact region are electrically connected at the first node;
the second base contact region and the second emitter contact region are electrically connected at the second node; and
the first collector well region resides laterally between the second base well region and the diode region.

18. The semiconductor device of claim 11, wherein the breakdown voltage of the first diode is greater than a sum of a first holding voltage between the first collector region and the second node and a second holding voltage of the second protection arrangement.

19. A method of fabricating an electronic device, the method comprising:
forming a first protection circuitry arrangement on a substrate, the first protection circuitry arrangement comprising a first transistor element and a second transistor element formed on the substrate, wherein a first collector of the first transistor element is coupled to a second collector of the second transistor element at a first node;
forming a second protection circuitry arrangement on the substrate, wherein the second protection circuitry arrangement is coupled to the second transistor element at a second node, the second protection circuitry arrangement being electrically in series between the second node and a third node;

forming a diode element adjacent to the first protection circuitry arrangement, wherein a cathode of the diode element is electrically connected to the first collector at the first node and an anode of the diode element is electrically connected to the third node, wherein forming the diode element comprises:

forming the cathode in the substrate adjacent to the first collector; and forming the anode in the substrate spaced apart from the cathode by a separation distance that results in a breakdown voltage between the cathode and the anode that is less than a sum of a first breakdown voltage of the second transistor element and a second breakdown voltage of the second protection circuitry arrangement;

providing a first electrical connection between the first protection circuitry arrangement and a first device terminal; and providing a second electrical connection between the third node and a second device terminal.

20. The method of claim 19, wherein forming the cathode comprises forming a portion of the first collector that laterally extends towards the anode.

* * * * *